United States Patent [19]

Dupuis

[11] 4,028,790

[45] June 14, 1977

[54] REMOVAL OF CONNECTOR PINS

[75] Inventor: Jean Marcel Dupuis, Ottawa, Canada

[73] Assignee: Northern Telecom Limited, Montreal, Canada

[22] Filed: Mar. 25, 1976

[21] Appl. No.: 670,538

[52] U.S. Cl. .................................. 29/764; 228/264

[51] Int. Cl.[2] .......................................... H05K 3/00

[58] Field of Search ..... 29/203 B, 203 H, 203 HM, 29/427, 426, 243.52, 243.53, 243.54, 509; 72/391; 225/103, 93 R; 228/264

[56] References Cited

UNITED STATES PATENTS

| | | | |
|---|---|---|---|
| 1,829,696 | 10/1931 | Wylie et al. | 72/391 |
| 3,045,336 | 7/1962 | Northrop et al. | 29/203 H |
| 3,143,903 | 8/1964 | Hecke | 29/243.52 |
| 3,164,283 | 1/1965 | Olson | 29/243.52 |
| 3,646,800 | 3/1972 | Martin | 72/391 |
| 3,886,782 | 6/1975 | Miyamoto | 72/391 |

*Primary Examiner*—James R. Duzan

*Attorney, Agent, or Firm*—Sidney T. Jelly

[57] ABSTRACT

The removal of connector pins from a panel, such as a printed circuit board, in which the pin extends from the panel and is soldered to a circuit member on one or both sides of the panel, is achieved by a tool positioned over the pin and having a main body member which is held in contact with the panel surface and with an axially sliding gripping member having a split gripping portion. The gripping member is moved by a tubular member surrounding the gripping member and which, on axial movement, forces the split gripping portion of the gripping member into firm frictional contact with the pin, further axial movement of the tubular member moving the gripping member and pin axially shearing the solder joint. The tubular member is moved by a pivotally mounted handle, the reaction from the pivoting of the handle and pulling on the pin holding the tool firmly against the panel. The pin is removed without damage to the panel and a new pin can be inserted and resoldered using the remaining solder at the joint.

2 Claims, 4 Drawing Figures

REMOVAL OF CONNECTOR PINS

This invention relates to the removal of connector pins from panels, circuit boards, connector blocks and similar articles.

In many wiring positions, particularly in panels in telecommunications systems and similar systems, conductors are connected to pins which enter, or pass through a panel or other member. Often large numbers of such pins are provided at quite small centre to centre spacing. A pin may pass right through a panel or board, with conductors attached at both ends. Typically pins may be of a square cross-section for connection of conductors by wire wrapping.

Whatever the form of pin, it occurs that a pin is damaged. The damage can occur during manufacture or during connection or reconnection. It is then desirable that the pin be replaced. Such replacement must be done without damage to the board. Usually a pin may be in contact with a circuit part, for example a printed circuit, being soldered to the circuit. The soldered contact must be broken without damage.

Conventionally, to remove a damaged pin, it is cut off as close as possible to the surface of the panel or board. A hole is then drilled in the pin as close as possible to the centre. Heat is then applied, with a soldering iron, to remove the remainder of the pin. A new pin is inserted and solder applied, one side or both sides, hopefully making contact with the previous area around the original pin. Often the hole in the board or panel is damaged. In laminated materials, delamination can occur. Where plated through holes are provided for the pins, and plating is removed from the hole when the old pin is removed. Thus the replacement of a pin is difficult and not always resulting in the efficient replacement.

The present invention provides for the removal of pins by a tool which grips the pin and then pulls on the pin while pushing against the panel or board. Soldered connections between pin and board are sheared and most of the solder, and plating in the holes where holes are plated through, remains intact and this assists in the emplacement of a new pin.

As a particular example of the present invention, apparatus for removing a pin extending from a panel and soldered to at least one surface thereof, comprises a main body member including a hollow bottom portion and an offset top portion, the bottom portion including an inwardly extending annular flange having a bottom face for positioning against the panel; a fixed handle attached to the top portion of the body member and extending laterally therefrom; a moveable handle pivotally mounted on the top portion, moveable about a pivot extending normal to the axis of the fixed handle, the moveable handle including a main portion on one side of the pivot and overlying the fixed handle, and also including an extension on the other side of the pivot; a tubular member mounted in the hollow bottom portion of the body member for axial movement therein, the tubular member including a tapered bore at a lower end extending downwardly and inwardly, and at least one protrusion at an upper end in engagement with the extension on the moveable handle, the lower end of the tubular member resting against the annular flange of the bottom portion of the body member; a gripping member mounted in the tubular member for axial movement therein and including upper and lower parts, the lower part hollow and split, to receive a pin, and including a tapered external surface at the extremity of the lower part adapted to cooperate with the tapered bore at the lower end of the tubular member, the arrangement such that pivoting of the moveable handle to move the main portion toward the fixed handle, moves the extension in a direction away from the bottom portion of the body member, the extension in engagement with the protrusion to move the tubular member axially, initial movement of the tubular member forcing the extremity of the gripping member into engagement with a pin, further movement pulling the tubular member, gripping member and pin from the panel, shearing the solder joint, reaction on the body member holding the bottom face in contact with the panel.

The invention will be readily understood by the following description of one form of tool, in conjunction with the accompanying drawings, in which.

Figure 2:
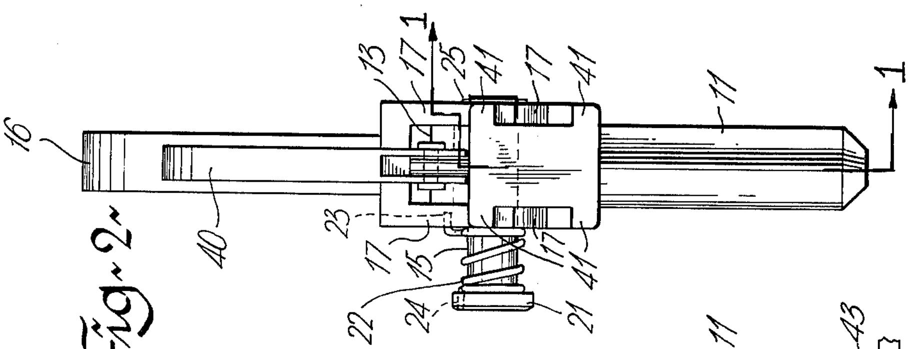
FIG. 2 is a front view of the tool of FIG. 1.

The tool comprises a main body member 10 having a bottom portion 11 of square cross section, and having a bore 12 therethrough. The top portion 13 is offset from the axis of the bottom portion 11 and has a transverse bore 14 therethrough. The bore 14 accepts a pivot pin 15 on which is pivotally mounted a moveable handle 16 having two spaced apart limbs or extensions 17. The extensions 17 are spaced apart to straddle the top portion 13 of the body member 10 and have transverse bores through which passes the pivot pin 15. In the rear face 18 of the top portion 13 is a threaded bore 19 into which screws the end of a fixed handle 20.

The pivot pin 15 extends from one side of the tool, as seen in FIG. 2, and has an enlarged head 21. A tension spring 22 is wrapped round the pin extension, one end of the spring held in a hole 23 in one of the extensions 17, and the other end of the spring held in a hole 24 in the enlarged head 21. At the end remote from the enlarged head 21, the pin is grooved circumferentially to receive a lock ring 25. A screw (not shown) in the top portion engages with the pivot pin to prevent rotation. The lower end of the bottom portion 13 has an inwardly extending annular flange 26 forming a bore 27. The bore 27 is a fairly close fit around the pin to be removed.

Positioned in the bore 12 in the bottom portion 11 of the body member 10 is a tubular member 30. Positioned in the bore of the tubular member 30 is a pin gripping member 31. Gripping member 31 has a central part 32 which is a sliding fit in the bore of the tubular member 30. Above the central part 32, the gripping member 31 is of reduced diameter and passes through a bush 33 threaded into the top end of the tubular member 30. A compression spring 34 surrounds the upper part of the gripping member and abuts against the bush 33 and the central part 32.

Below the central part 32, the gripping member is bifurcated to form two members 35. At its lower extremity the inner surfaces 36 of the two members 35 are serrated. The outer surfaces 37 of the members 35 are tapered downwardly and inwardly and fit into a tapered bore at the lower end of the tubular member, the bore conveniently formed in a bush 38 screwed into the lower end of the tubular member 30.

The upper end of the gripping member 31 extends up out of the tubular member 30 and carries a cam level 40. The cam lever 40 bears against the top surface of the tubular member 30 and can lift the gripping member 31 against the action of the spring 34.

The upper end of the tubular member 30 is enlarged, having two protrusions 41, one on each sde. Slots cut in the protrusions 41 accept the ends of the two extensions 17 of the moveable handle 16.

Figure 1:
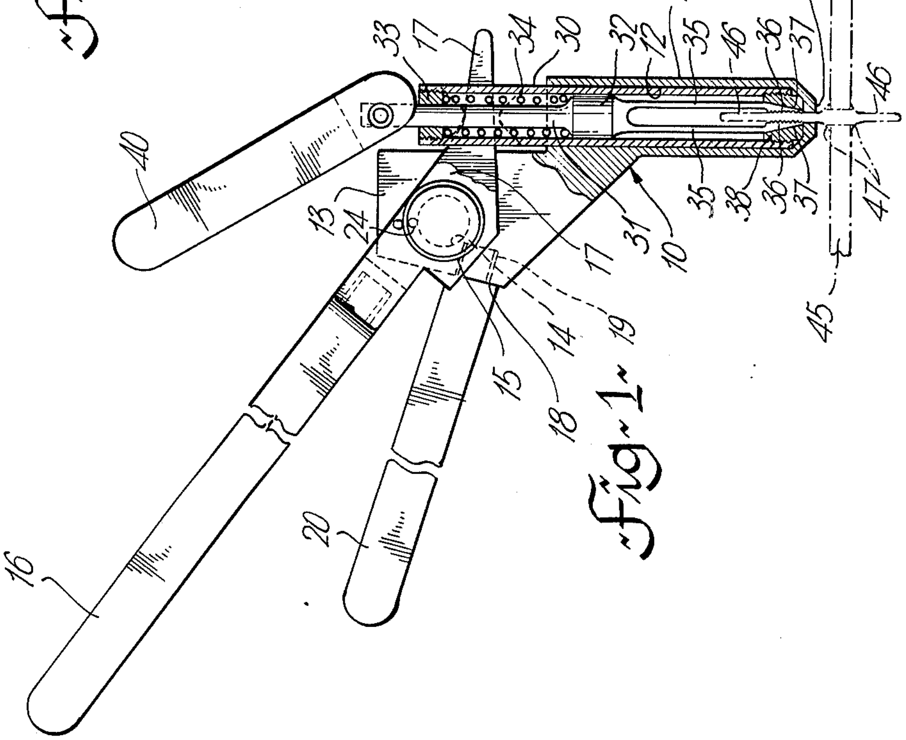
FIG. 1 is a side view of a tool, partly in section as on the line I—I of FIG. 2.

The tool is used as follows. The tool is positioned over a pin, the pin extending through the bore 27 in the body member 10 and up between the members 35 of the gripping member 31. The lower end 43 of the body member is pushed down until it contacts the board, or more precisely, the solder fillet around the pin. This is indicated in FIG. 1, the board 45 and pin 46, with solder fillets 47, shown in dotted outline. The two handles 16 and 20 are then squeezed together by the pivoting of moveable handle 16. As handle 16 pivots, the extensions 17 pull upward on the protrusions 41. This pulls the tubular member 30 upward and the tapered surfaces of the bush 38 acting on the tapered surfaces 37 of the members 35 of the gripping member 31 forces the serrated surfaces 36 into gripping engagement with the pin 46. Continued movement of the handle 16 pulls on the pin, the reaction pushing the lower end 43 of the body member against the solder fillet 47. This opposed pulling and pushing, with the close fit of the bore 27 around the pin 45 causes the solder joint around the pin to shear and the pin is pulled out cleanly, without damaging the board, leaving most of the original solder in place, and where plated through holes are used, does not damage the plating in the hole.

The members 35 are finally retracted by the lever 40. This lifts the gripping member 31 up disengaging the tapered surfaces of the members 35 and the bush 38. The pin is then pulled out of the tool. Release of the lever 40 allows the gripping member to return to its initial position. The clearance between the serrated surfaces 36 is such that there is initial friction between the serrations and the pin on initial positioning of the tool over a pin.

Figure 3:
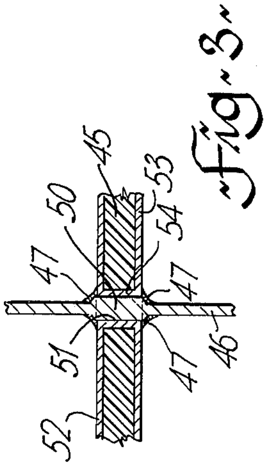
FIGS. 3 and 4 are cross sections illustrating a pin in a board, and removed from a board respectively.
Figure 4:
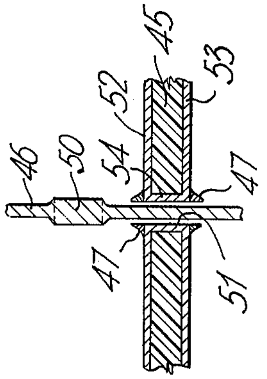

FIGS. 3 and 4 illustrate a pin in a printed circuit board, and removed from the board respectively. The pin is swaged at an intermediate position 50 to provide a fairly tight fit in the hole 51. The particular board shown has printed circuits 52 and 53 on each side, and the holes 51 are plated through at 54.

A new pin is easily inserted, with a conventional insertion tool, and heat applied to the pin will melt the solder 47 and remake a satisfactory connection. The tool is of a size which permits removal of pins in a closely spaced board or panel. The panel or board is not heated at all for pin removal, and only slightly on pin insertion.

While the pins 46, in the present example, are of square cross-section, round pins can also be extracted. For round pins, the lower end of the gripping member 31 would have a threaded hole formed, prior to slitting for example, the threads then acting as serrations.

I claim:

1. Apparatus for removing a pin extending from a panel and soldered to at least one surface thereof, comprising:

a main body member including a hollow bottom portion and an offset top portion, said bottom portion including an inwardly extending annular flange having a bottom face for positioning against said panel;

a fixed handle attached to said top portion and extending laterally therefrom;

a moveable handle pivotally mounted on said top portion, moveable about a pivot extending normal to the axis of said fixed handle, said moveable handle including a main portion on one side of said pivot and overlying said fixed handle and also including an extension on the other side of said pivot;

a tubular member mounted in said hollow bottom portion for axial movement therein, said tubular member including a tapered bore at a lower end, said tapered bore extending downwardly and inwardly, and at least one protrusion at an upper end, said protrusion in engagement with said extension on said moveable handle, the lower end of said tubular member resting against said annular flange of said bottom portion of said body member;

a gripping member mounted in said tubular member for axial movement therein, said gripping member comprising a central part a close sliding fit in said tubular member for guidance of said gripping member, a lower part of hollow form and split longitudinally to form two opposed gripping surfaces, and an upper part of reduced diameter and extending up through the upper end of said tubular member beyond said extension on said moveable hand and said protrusion on said tubular member, said central part forming a lower abutment for a spring;

an abutment at the upper end of said tubular member and a compression spring extending between said abutments; and a cam lever pivotally mounted on the upper end of said upper part of said gripping member, said cam lever pivotal about an axis normal to the longitudinal axis of said gripping member, said cam lever engaging with the upper end of said tubular member, pivotal movement of said cam lever lifting said gripping member axially relative to said tubular member to open said lower part of said gripping member and retains said pin;

the arrangement such that pivoting of said moveable handle to move said main portion toward said fixed handle, moves said extension in a direction away from said bottom portion of said body member, said extension in engagement with said protrusion to move said tubular member axially, initial movement of said tubular member forcing said extremity of said gripping member into engagement with a pin within said gripping member, further movement pulling said tubular member, gripping member and pin from said panel, shearing the solder joint, reaction on said body member holding said bottom face in contact with said panel.

2. Apparatus as claimed in claim 1, said split hollow lower part of said gripping member having serrated opposed surfaces for gripping the pin.

* * * * *